(12) United States Patent
Hsu et al.

(10) Patent No.: US 10,895,587 B2
(45) Date of Patent: Jan. 19, 2021

(54) WAFER PROBE STATION

(71) Applicant: MPI Corporation, Hsinchu County (TW)

(72) Inventors: Yu-Hsun Hsu, Hsinchu County (TW); Jhih-Wei Fang, Hsinchu County (TW); Stojan Kanev, Hsinchu County (TW); Sebastian Giessmann, Hsinchu County (TW)

(73) Assignee: MPI Corporation, Hsinchu County (TW)

( * ) Notice: Subject to any disclaimer, the term of this patent is extended or adjusted under 35 U.S.C. 154(b) by 152 days.

(21) Appl. No.: 16/233,051

(22) Filed: Dec. 26, 2018

(65) Prior Publication Data

US 2020/0209279 A1    Jul. 2, 2020

(51) Int. Cl.
| | | |
|---|---|---|
| *G01R 31/00* | (2006.01) | |
| *G01R 1/04* | (2006.01) | |
| *G01R 1/18* | (2006.01) | |
| *G01R 31/28* | (2006.01) | |
| *G01R 1/067* | (2006.01) | |

(52) U.S. Cl.
CPC ....... *G01R 1/0491* (2013.01); *G01R 1/06705* (2013.01); *G01R 1/18* (2013.01); *G01R 31/2831* (2013.01)

(58) Field of Classification Search
USPC .......................................... 324/750.27, 627
See application file for complete search history.

(56) References Cited

U.S. PATENT DOCUMENTS

| | | | |
|---|---|---|---|
| 8,278,951 B2 | 10/2012 | Kanev et al. | |
| 2017/0205446 A1* | 7/2017 | Simmons | G01R 1/06705 |
| 2019/0391195 A1* | 12/2019 | Kvarnstrand | H04B 17/15 |

FOREIGN PATENT DOCUMENTS

| | | |
|---|---|---|
| TW | 200628802 A | 8/2006 |
| TW | 201725393 A | 7/2017 |
| TW | 201736855 A | 10/2017 |

* cited by examiner

*Primary Examiner* — Vincent Q Nguyen
(74) *Attorney, Agent, or Firm* — CKC & Partners Co., LLC

(57) ABSTRACT

A wafer probe station includes a first shielding box, a chuck, a stage, a second shielding box, an electronic testing instrument, a manipulator and a cable. The first shielding box has a first chamber. The chuck is located in the first chamber to hold a device under test. The stage connects to the chuck to move the chuck. The second shielding box is outside the first shielding box and forms a second chamber with the first shielding box. The first and the second shielding boxes shield against an electromagnetic field. The electronic testing instrument is inside the second chamber. The manipulator is outside the first shielding box and has a probe arm penetrating into the first chamber. The probe arm is movable by the manipulator to hold a probe to contact the device under test. The cable connects between the electronic testing instrument and the probe.

13 Claims, 3 Drawing Sheets

WAFER PROBE STATION

BACKGROUND

Technical Field

The present disclosure relates to wafer probe stations.

Description of Related Art

As the demand for electronic devices has been increasing nowadays, the quality of the components of the electronic devices correspondingly becomes an important issue of the semiconductor industry. Apart from the improving technology of manufacture for the components, the accuracy of testing for the components has also become more important.

For example, wafer probe stations are in general used to test the quality of the wafers or dies in the semiconductor industry. Hence, the operational accuracy of wafer probe stations is undoubtedly concerned.

SUMMARY

A technical aspect of the present disclosure is to provide a wafer probe station, which can maintain the accuracy of the electrical test even if an electrical signal of an electric current with a low ampere or a low voltage is utilized.

According to an embodiment of the present disclosure, a wafer probe station includes a first shielding box, a chuck, a stage, a second shielding box, an electronic testing instrument, at least one manipulator and a cable. The first shielding box has a first chamber within. The chuck is located in the first chamber and configured to hold a device under test. The stage is connected to the chuck and configured to move the chuck. The second shielding box is located outside the first shielding box. The second shielding box and the first shielding box together form a second chamber therebetween. The first shielding box and the second shielding box are configured to shield against an electromagnetic field. The electronic testing instrument is located inside the second chamber. The manipulator is located outside the first shielding box. The manipulator has at least one probe arm penetrating into the first chamber through the first shielding box. The probe arm is movable by the manipulator and configured to hold a probe to contact with the device under test. The cable is connected between the electronic testing instrument in the second chamber and the probe in the first chamber.

In one or more embodiments of the present disclosure, the first shielding box is made of a metallic material.

In one or more embodiments of the present disclosure, the second shielding box is made of a metallic material.

In one or more embodiments of the present disclosure, the first shielding box, the second shielding box and the electronic testing instrument are electrically connected to a same ground.

In one or more embodiments of the present disclosure, the second shielding box is detachably connected with the first shielding box.

In one or more embodiments of the present disclosure, the manipulator includes at least an electronic component.

In one or more embodiments of the present disclosure, the manipulator is manually controlled.

In one or more embodiments of the present disclosure, the electronic testing instrument has an extension portion. The extension portion at least partially protrudes towards the platform. The cable is connected between the extension portion and the probe.

In one or more embodiments of the present disclosure, the first shielding box has a first opening. The first opening communicates with the second chamber. The cable penetrates through the first opening.

In one or more embodiments of the present disclosure, the first shielding box has a second opening. The wafer probe station further includes a first shielding plate slidably connected with the first shielding box. The probe arm slidably connects with the first shielding plate and penetrates through the second opening.

In one or more embodiments of the present disclosure, the stage has a moving portion and a stationary portion. The stationary portion is located outside the first shielding box. The moving portion is connected to the chuck and is configured to move relative to the stationary portion.

In one or more embodiments of the present disclosure, the first shielding box has a third opening. The wafer probe station further includes a second shielding plate slidably connected with the first shielding box. The moving portion slidably connects with the second shielding plate and penetrates through the third opening.

When compared with the prior art, the above-mentioned embodiments of the present disclosure have at least the following advantages:

(1) Since the first shielding box and the second shielding box shield against electromagnetic field from the outside, even if the electrical signal transmitted from the electronic testing instrument to the probe through the cable is of an electric current with a low ampere or a low voltage, which is relatively sensitive to electromagnetic influence, the accuracy of the electrical test can still be maintained.

(2) Since the manipulator is located outside the first shielding box, even if an electromagnetic field is generated by the electronic component due to the operation of the manipulator, the electromagnetic field generated by the electronic component of the manipulator is shielded by the first shielding box. Thus, the electric signal transmitted from the electronic testing instrument to the probe through the cable partially inside the first shielding box and partially inside the second shielding box is not affected by the manipulator which is electrically controlled.

(3) Since the first shielding box, the second shielding box and the electronic testing instrument are electrically connected to the same ground, voltage differences among the first shielding box, the second shielding box and the electronic testing instrument are avoided, facilitating the accuracy of the electrical test of the wafer probe station.

BRIEF DESCRIPTION OF THE DRAWINGS

The disclosure can be more fully understood by reading the following detailed description of the embodiments, with reference made to the accompanying drawings as follows.

DETAILED DESCRIPTION

Figure 1:
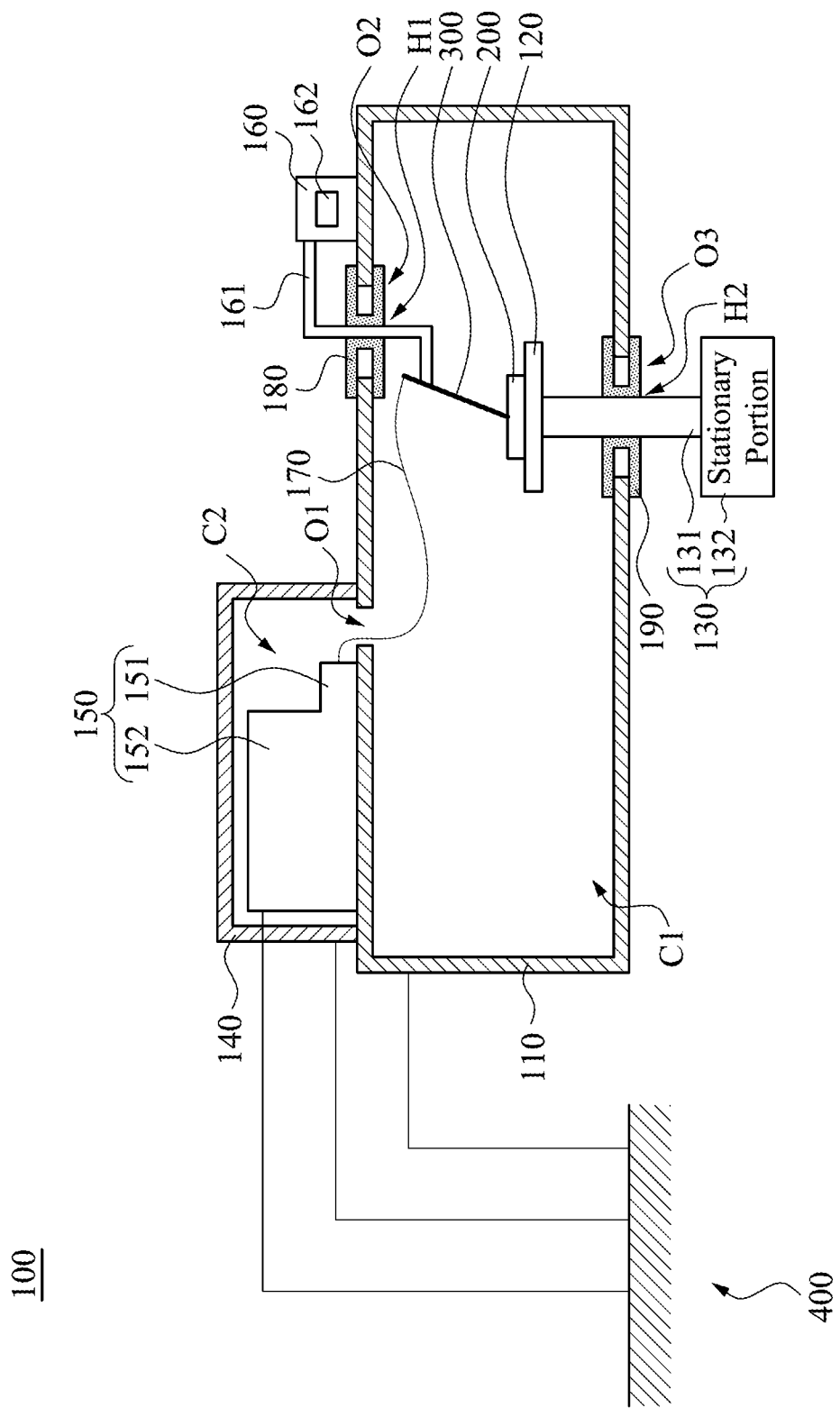
FIG. 1 is a schematic view of a wafer probe station according to an embodiment of the present disclosure.

Drawings will be used below to disclose embodiments of the present disclosure. For the sake of clear illustration, many practical details will be explained together in the description below. However, it is appreciated that the practical details should not be used to limit the claimed scope. In other words, in some embodiments of the present disclosure, the practical details are not essential. Moreover, for the sake of drawing simplification, some customary structures and elements in the drawings will be schematically shown in a simplified way. Wherever possible, the same reference numbers are used in the drawings and the description to refer to the same or like parts.

Unless otherwise defined, all terms (including technical and scientific terms) used herein have the same meanings as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference is made to FIG. 1. FIG. 1 is a schematic view of a wafer probe station 100 according to an embodiment of the present disclosure. In this embodiment, as shown in FIG. 1, a wafer probe station 100 includes a first shielding box 110, a chuck 120, a stage 130, a second shielding box 140, an electronic testing instrument 150, at least one manipulator 160 and a cable 170. The first shielding box 110 has a first chamber C1 within. The chuck 120 is located in the first chamber C1 of the first shielding box 110. The chuck 120 is configured to hold a device under test (DUT) 200. The stage 130 is connected to the chuck 120. The stage 130 is configured to move the chuck 120. The second shielding box 140 is located outside the first shielding box 110 and is detachably connected with the first shielding box 110. The second shielding box 140 and the first shielding box 110 together form a second chamber C2 therebetween. The first shielding box 110 and the second shielding box 140 are configured to shield against an electromagnetic field. The electronic testing instrument 150 is located in the second chamber C2. The manipulator 160 is located outside the first shielding box 110. The manipulator 160 has at least one probe arm 161. The probe arm 161 penetrates into the first chamber C1 through the first shielding box 110. The probe arm 161 is movable by the manipulator 160. The probe arm 161 is configured to hold a probe 300 to contact with the device under test 200. In practical applications, the probe arm 161 does not include any electronic component. The cable 170 is connected between the electronic testing instrument 150 in the second chamber C2 and the probe 300 in the first chamber C1.

It is worth to note that the chuck 120 and the device under test 200 held by the chuck 120 are located in the first chamber C1 of the first shielding box 110. Moreover, the probe 300 to be in contact with the device under test 200 for an electrical test is also located in the first chamber C1 of the first shielding box 110. Meanwhile, the electronic testing instrument 150 is located in the second chamber C2. Therefore, the cable 170 connected between the electronic testing instrument 150 and the probe 300 is located partially in the first chamber C1 and partially in the second chamber C2.

Moreover, as shown in FIG. 1, the first shielding box 110 has a first opening O1. The first opening O1 communicates with the second chamber C2. The cable 170 penetrates through the first opening O1.

As mentioned above, the manipulator 160 is located outside the first shielding box 110. As a result, since the manipulator 160 is located outside the first shielding box 110 while the cable 170 is located partially in the first chamber C1 and partially in the second chamber C2, the cable 170 and the manipulator 160 are separated from each other and are isolated by the first shielding box 110 and the second shielding box 140.

During the operation of the wafer probe station 100, the device under test 200 is held by the chuck 120 inside the first shielding box 110. The electronic testing instrument 130 located in the second chamber C2 then transmits an electric signal to the probe 300 through the cable 170 connected therebetween. The electric signal is then transmitted to the device under test 200 from the probe 300, and an electrical test is subsequently carried out to the device under test 200.

Since the cable 170, the electronic testing instrument 150 and the probe 300 are located either inside the first shielding box 110 or the second shielding box 140 as mentioned above, the electromagnetic field appearing outside the first shielding box 110 and the second shielding box 140 is shielded by the first shielding box 110 and the second shielding box 140 and is not able to affect the electric signal transmitted from the electronic testing instrument 150 to the probe 300 through the cable 170 located partially in the first chamber C1 and partially in the second chamber C2. In this way, the testing error due to electromagnetic influence (EMI) from the outside of the first shielding box 110 and the second shielding box 140 is avoided and the accuracy of the electrical test is maintained. In this embodiment, the first shielding box 110 and the second shielding box 140 are made of a metallic material. However, this does not intend to limit the present disclosure.

Furthermore, since the first shielding box 110 and the second shielding box 140 shield against electromagnetic field from the outside, even if the electrical signal transmitted from the electronic testing instrument 150 to the probe 300 through the cable 170 is of an electric current with a low ampere or a low voltage, which is relatively sensitive to electromagnetic influence, the accuracy of the electrical test can still be maintained.

In addition, as shown in FIG. 1, the first shielding box 110 has a second opening O2. The wafer probe station 100 further includes a first shielding plate 180. The first shielding plate 180 is slidably connected with the first shielding box 110. The probe arm 161 is slidably connected with the first shielding plate 180 and penetrates through the second opening O2. In practice, the probe arm 161 fits with the hole H1 of the first shielding plate 180. Moreover, the first shielding plate 180 is snapped with the first shielding box 110, and at least a portion of the first shielding plate 180 is loosely located in the second opening O2 such that the first shielding plate 180 is movable relative to the first shielding box 110. In this way, when the probe arm 161 and thus the probe 300 held by the probe arm 161 is moved by the manipulator 160 relative to the device under test 200, the shielding of the cable 170, the probe 300 and the device under test 200 by the first shielding box 110 is maintained. Moreover, please be noted that other structural arrangements to maintain the structural integrity of the first shielding box 110 with regard to the movement of the probe arm 161 can be employed according to the actual situations. For example, the second opening O2 of the first shielding box 110 can be fitted with an electrical feed through (not shown). In this case, the cable 170 is connected from the electronic testing instrument 150 to the electrical feed through instead.

Furthermore, in this embodiment, the stage 130 has a moving portion 131 and a stationary portion 132. The stationary portion 132 is located outside the first shielding box 110. The moving portion 131 is connected to the chuck 120. The moving portion 131 is configured to move relative to the stationary portion 132.

In addition, as shown in FIG. 1, the first shielding box 110 has a third opening O3. The wafer probe station 100 further includes a second shielding plate 190. The second shielding plate 190 is slidably connected with the first shielding box 110. The moving portion 131 of the stage 130 is slidably connected with the second shielding plate 190 and penetrates through the third opening O3. In practice, the moving portion 131 fits with the hole H2 of the second shielding plate 190. Moreover, the second shielding plate 190 is snapped with the first shielding box 110, and at least a portion of the second shielding plate 190 is loosely located in the third opening O3 such that the second shielding plate 190 is movable relative to the first shielding box 110. In this way, when the moving portion 131 is moved relative to the stationary portion 132 of the stage 130, the shielding of the cable 170, the probe 300 and the device under test 200 by the first shielding box 110 is maintained. Moreover, please be noted that other structural arrangements to maintain the structural integrity of the first shielding box 110 with regard to the movement of the moving portion 131 of the stage 130 can be employed according to the actual situations.

On the other hand, as shown in FIG. 1, the first shielding box 110, the second shielding box 140 and the electronic testing instrument 150 are electrically connected to the same ground 400. In this way, voltage differences among the first shielding box 110, the second shielding box 140 and the electronic testing instrument 150 are avoided, facilitating the accuracy of the electrical test of the wafer probe station 100.

In this embodiment, as shown in FIG. 1, the manipulator 160 includes at least an electronic component 162 such that the manipulator 160 is electrically controlled. However, as mentioned above, the manipulator 160 is located outside the first shielding box 110. Therefore, even if an electromagnetic field is generated by the electronic component 162 due to the operation of the manipulator 160, the electromagnetic field generated by the electronic component 162 of the manipulator 160 is shielded by the first shielding box 110. Thus, the electric signal transmitted from the electronic testing instrument 150 to the probe 300 through the cable 170 partially inside the first shielding box 110 and partially inside the second shielding box 140 is not affected by the manipulator 160 which is electrically controlled. The electronic component 162, for example, could be a motor, or other electronic elements. The electromagnetic field generated by the electronic component 162 of the manipulator 160 is shielded by the second shielding box 140.

Figure 2:
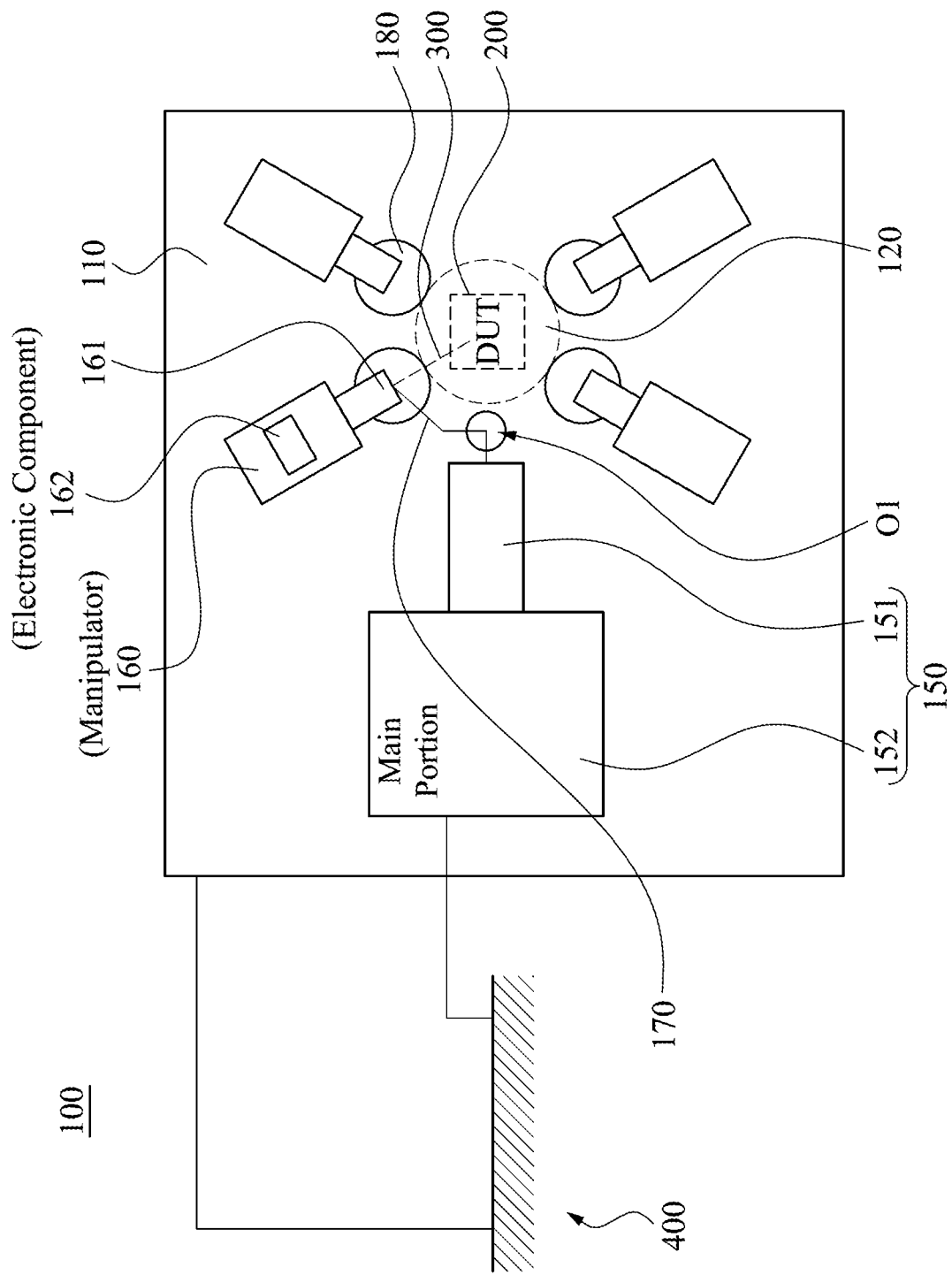
FIG. 2 is a top view of the wafer probe station of FIG. 1, with the second shielding box not shown for illustrative convenience.

Reference is made to FIG. 2. FIG. 2 is a top view of the wafer probe station 100 of FIG. 1, with the second shielding box 140 not shown for illustrative convenience. In this embodiment, as shown in FIG. 1 and FIG. 2, the electronic testing instrument 150 has an extension portion 151 and a main portion 152. The extension portion 151 and the main portion 152 are connected to each other. Furthermore, the extension portion 151 at least partially protrudes away from the main portion 152 towards the region above the chuck 120, such that the extension portion 151 of the electronic testing instrument 150 is close to the chuck 120. Moreover, as shown in FIG. 1 and FIG. 2, the cable 170 is connected between the extension portion 151 of the electronic testing instrument 150 and the probe 300. In this way, the length of the cable 170 can be practically reduced, such that the effect to the electrical test of the device under test 200 due to the length of the cable 170 can be minimized.

To be specific, as shown in FIG. 1 and FIG. 2, the cable 170 is connected to a surface of the extension portion 151 away from the main portion 152. In some other embodiments, according to the actual situation, the cable 170 can be directly connected to the main portion 152 of the electronic testing instrument 150 in the absence of the extension 151.

Furthermore, the quantity of the manipulator 160 can be plural. For illustrative convenience, the plurality of the manipulators 160 is not shown in FIG. 1. As shown in FIG. 2, the manipulators 160 are substantially distributed around and above the chuck 120. For illustrative convenience, only connections of one of the manipulators 160 with the cable 170 and the probe 300 are shown, and only the corresponding manipulator 160 is electrically connected to the ground 400 in FIG. 2. In practical applications, the extension portion 151 of the electronic testing instrument 150 is at least partially located between two adjacent manipulators 160. However, this does not intend to limit the present disclosure.

Figure 3:
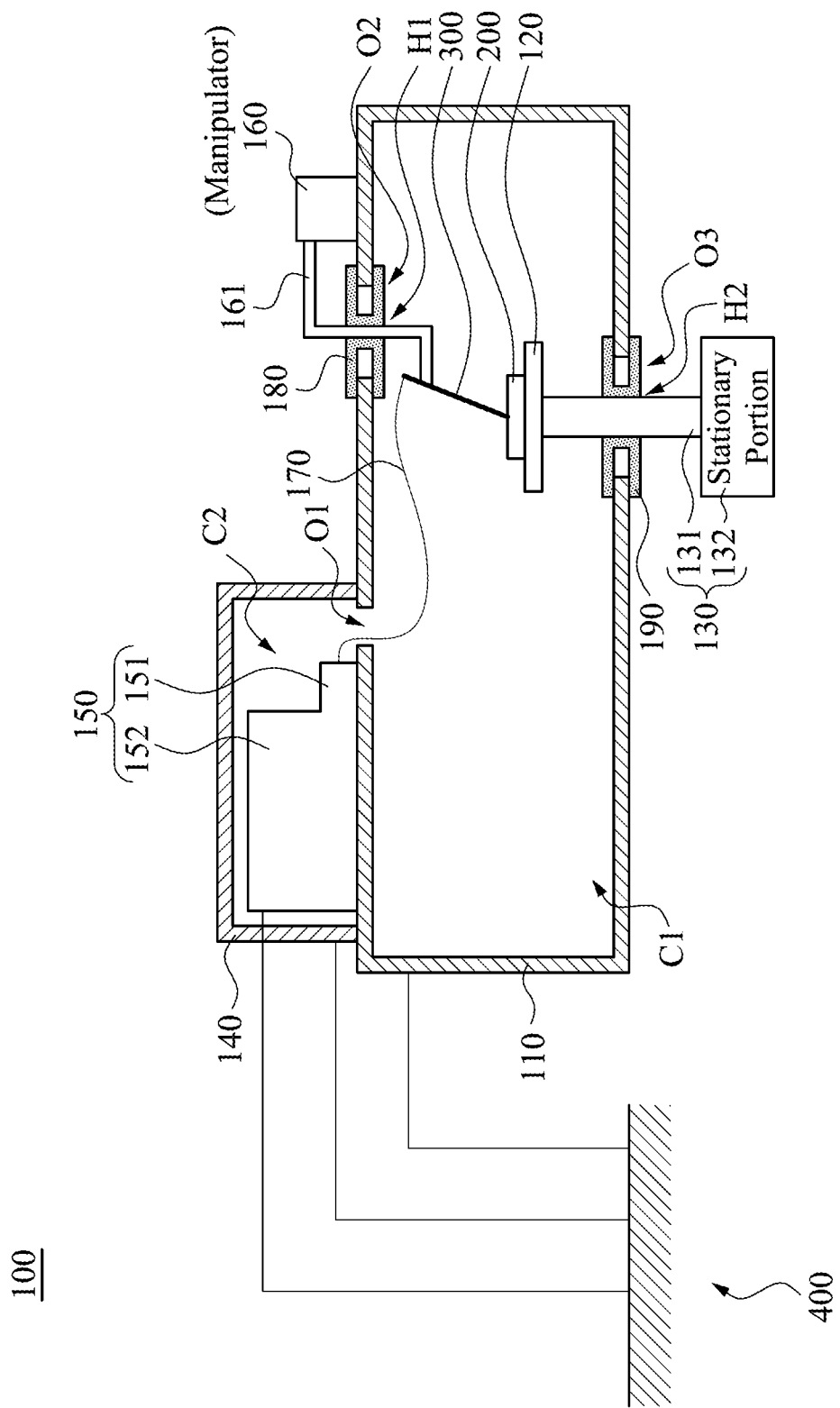
FIG. 3 is a schematic view of a wafer probe station according to another embodiment of the present disclosure.

Reference is made to FIG. 3. FIG. 3 is a schematic view of a wafer probe station 100 according to another embodiment of the present disclosure. As shown in FIG. 3, in this embodiment, according to actual situations, the manipulator 160 is manually controlled. In other words, the manipulator 160 is not equipped with any electronic component. Since the manipulator 160 is located outside the first shielding box 110, the manual control of the manipulator 160 is made convenient, and the manipulator 160 can be easily accessed for maintenance or replacement.

In conclusion, when compared with the prior art, the aforementioned embodiments of the present disclosure have at least the following advantages.

(1) Since the first shielding box and the second shielding box shield against electromagnetic field from the outside, even if the electrical signal transmitted from the electronic testing instrument to the probe through the cable is of an electric current with a low ampere or a low voltage, which is relatively sensitive to electromagnetic influence, the accuracy of the electrical test can still be maintained.

(2) Since the manipulator is located outside the first shielding box, even if an electromagnetic field is generated by the electronic component due to the operation of the manipulator, the electromagnetic field generated by the electronic component of the manipulator is shielded by the first shielding box. Thus, the electric signal transmitted from the electronic testing instrument to the probe through the cable partially inside the first shielding box and partially inside the second shielding box is not affected by the manipulator which is electrically controlled.

(3) Since the first shielding box, the second shielding box and the electronic testing instrument are electrically connected to the same ground, voltage differences among the first shielding box, the second shielding box and the electronic testing instrument are avoided, facilitating the accuracy of the electrical test of the wafer probe station.

Although the present disclosure has been described in considerable detail with reference to certain embodiments thereof, other embodiments are possible. Therefore, the spirit and scope of the appended claims should not be limited to the description of the embodiments contained herein.

It will be apparent to the person having ordinary skill in the art that various modifications and variations can be made to the structure of the present disclosure without departing from the scope or spirit of the present disclosure. In view of the foregoing, it is intended that the present disclosure cover modifications and variations of the present disclosure provided they fall within the scope of the following claims.

What is claimed is:

1. A wafer probe station, comprising:
a first shielding box having a first chamber within;
a chuck located in the first chamber and configured to hold a device under test;
a stage connected to the chuck and configured to move the chuck;
a second shielding box located outside the first shielding box, the second shielding box and the first shielding box together forming a second chamber therebetween, the first shielding box and the second shielding box being configured to shield against an electromagnetic field;
an electronic testing instrument located in the second chamber;
at least one manipulator located outside the first shielding box and having at least one probe arm penetrating into the first chamber through the first shielding box, the probe arm being movable by the manipulator and configured to hold a probe to contact with the device under test; and
a cable connected between the electronic testing instrument in the second chamber and the probe in the first chamber.

2. The wafer probe station of claim 1, wherein the first shielding box is made of a metallic material.

3. The wafer probe station of claim 1, wherein the second shielding box is made of a metallic material.

4. The wafer probe station of claim 1, wherein the first shielding box, the second shielding box and the electronic testing instrument are electrically connected to a same ground.

5. The wafer probe station of claim 1, wherein the second shielding box is detachably connected with the first shielding box.

6. The wafer probe station of claim 1, wherein the manipulator comprises at least an electronic component.

7. The wafer probe station of claim 6, wherein the electronic component is a motor.

8. The wafer probe station of claim 1, wherein the manipulator is manually controlled.

9. The wafer probe station of claim 1, wherein the electronic testing instrument has a main portion and an extension portion at least partially protruding away from the main portion, the cable is connected between the extension portion and the probe.

10. The wafer probe station of claim 1, wherein the first shielding box has a first opening communicating with the second chamber, the cable penetrating through the first opening.

11. The wafer probe station of claim 1, wherein the first shielding box has a second opening, the wafer probe station further comprises a first shielding plate slidably connected with the first shielding box, the probe arm slidably connects with the first shielding plate and penetrates through the second opening.

12. The wafer probe station of claim 1, wherein the stage has a moving portion and a stationary portion, the stationary portion is located outside the first shielding box, the moving portion is connected to the chuck and is configured to move relative to the stationary portion.

13. The wafer probe station of claim 12, wherein the first shielding box has a third opening, the wafer probe station further comprises a second shielding plate slidably connected with the first shielding box, the moving portion slidably connects with the second shielding plate and penetrates through the third opening.

* * * * *